United States Patent
Ibrahim et al.

(10) Patent No.: US 11,068,458 B2
(45) Date of Patent: Jul. 20, 2021

(54) MECHANISM FOR DISTRIBUTED-SYSTEM-AWARE DIFFERENCE ENCODING/DECODING IN GRAPH ANALYTICS

(71) Applicant: Advanced Micro Devices, Inc., Santa Clara, CA (US)

(72) Inventors: Mohamed Assem Ibrahim, Santa Clara, CA (US); Onur Kayiran, Fairport, NY (US); Yasuko Eckert, Bellevue, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 416 days.

(21) Appl. No.: 16/202,082

(22) Filed: Nov. 27, 2018

(65) Prior Publication Data
US 2020/0167328 A1 May 28, 2020

(51) Int. Cl.
*G06F 16/22* (2019.01)
*G06F 16/901* (2019.01)

(52) U.S. Cl.
CPC ...... *G06F 16/2264* (2019.01); *G06F 16/9024* (2019.01)

(58) Field of Classification Search
CPC ............ G06F 16/2264; G06F 16/9024; H03M 7/3068
See application file for complete search history.

(56) References Cited

U.S. PATENT DOCUMENTS

| | | | |
|---|---|---|---|
| 10,795,909 B1* | 10/2020 | Bond | G06F 16/252 |
| 2016/0275201 A1* | 9/2016 | Li | G06F 16/221 |
| 2017/0083783 A1* | 3/2017 | Glover | H03M 7/30 |
| 2017/0091334 A1* | 3/2017 | Kabiljo | G06F 16/24578 |
| 2017/0357905 A1* | 12/2017 | Rossi | G06N 5/022 |
| 2017/0364534 A1* | 12/2017 | Zhang | G06N 5/04 |
| 2017/0365071 A1* | 12/2017 | Rossi | G06T 9/20 |

(Continued)

OTHER PUBLICATIONS

Chen, R., Ding, X., Wang, P., Chen, H., Zang, B., & Guan, H. (Jun. 2014). Computation and communication efficient graph processing with distributed immutable view. In Proceedings of the 23rd international symposium on High-performance parallel and distributed computing (pp. 215-226). ACM.

(Continued)

*Primary Examiner* — Pierre M Vital
*Assistant Examiner* — Zuheir A Mheir
(74) *Attorney, Agent, or Firm* — Liang & Cheng, PC

(57) ABSTRACT

A portion of a graph dataset is generated for each computing node in a distributed computing system by, for each subject vertex in a graph, recording for the computing node an offset for the subject vertex, where the offset references a first position in an edge array for the computing node, and for each edge of a set of edges coupled with the subject vertex in the graph, calculating an edge value for the edge based on a connected vertex identifier identifying a vertex coupled with the subject vertex via the edge. When the edge value is assigned to the first position, the edge value is determined by a first calculation, and when the edge value is assigned to position subsequent to the first position, the edge value is determined by a second calculation. In the computing node, the edge value is recorded in the edge array.

20 Claims, 13 Drawing Sheets

(56) References Cited

U.S. PATENT DOCUMENTS

| | | | |
|---|---|---|---|
| 2018/0349443 A1* | 12/2018 | Carter | G06F 16/245 |
| 2018/0367414 A1* | 12/2018 | Raghavendra | H04L 43/0817 |
| 2019/0171669 A1* | 6/2019 | Patankar | G01M 17/00 |
| 2019/0228036 A1* | 7/2019 | Becker | G06F 16/219 |
| 2020/0257982 A1* | 8/2020 | Kim | G06N 20/10 |
| 2021/0004374 A1* | 1/2021 | Xia | G06F 16/2455 |

OTHER PUBLICATIONS

Malewicz, G., Austern, M. H., Bik, A. J., Dehnert, J. C., Horn, I., Leiser, N., & Czajkowski, G. (Jun. 2010). Pregel: a system for large-scale graph processing. In Proceedings of the 2010 ACM SIGMOD International Conference on Management of data (pp. 135-146). ACM.

Roy, A., Mihailovic, I., & Zwaenepoel, W. (Nov. 2013). X-stream: Edge-centric graph processing using streaming partitions. In Proceedings of the Twenty-Fourth ACM Symposium on Operating Systems Principles (pp. 472-488). ACM.

Shun, J., & Blelloch, G. E. (Feb. 2013). Ligra: a lightweight graph processing framework for shared memory. In ACM Sigplan Notices (vol. 48, No. 8, pp. 135-146). ACM.

Shun, J., Dhulipala, L., & Blelloch, G. E. (Apr. 2015). Smaller and faster: Parallel processing of compressed graphs with Ligra+. In Data Compression Conference (DCC), 2015 (pp. 403-412). IEEE.

Zhang, K., Chen, R., & Chen, H. (2015). NUMA-aware graph-structured analytics. ACM SIGPLAN Notices, 50(8), 183-193.

* cited by examiner

MECHANISM FOR DISTRIBUTED-SYSTEM-AWARE DIFFERENCE ENCODING/DECODING IN GRAPH ANALYTICS

BACKGROUND

Graph analytics is a popular application domain because many machine learning, data mining and scientific computation can be modeled as graph-structured computation. One dimension to the performance and cost of the graph analytics is the graph data size. Recent growth in graph data sizes has motivated the use of graph compression to manage the storage of graph data. Difference, or delta, encoding is an encoding scheme that represents the data in the form of differences between sequential raw data values rather than the raw value itself. Difference encoding is used to encode the raw data before applying compression. Existing compression approaches based on difference encoding for graph analytics systems are neutral to distributed systems (e.g., a group of computers or a non-uniform memory access (NUMA) machine) and thus have suboptimal performance on these systems.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the scope of the embodiments.

The performance of graph analytics computations is affected by graph data sizes. Recent growth in data sizes has motivated the use of graph compression to manage the storage of graph data. Even if a graph dataset is able to fit in the main memory of a single multi-core machine, the cost of a machine of purchasing or renting such a machine increases with its memory capacity. Thus, reducing the sizes of the graph datasets by compression also reduces the cost of performing large-scale graph analytics. However, compression techniques that operate based on difference encoding for graph analytics systems that are oblivious to the characteristics of distributed systems characteristics can have suboptimal performance due to costly remote communication between the distributed nodes for the correct decoding of the graph data. Without such remote communication, the incorrect decoding of the graph data is likely to occur.

Difference encoding is an encoding scheme that represents data in the form of differences between sequential raw data rather than the raw value itself. For example, the values 2, 4, 6, 9, 7, would be encoded as 2, 2, 2, 3, −2. This reduces the variance of the values when neighbor samples are correlated, enabling a lower bit usage for the same data. Difference encoding is used to encode the raw data before applying compression on it. For example, variable-length codes (i.e., k-bit codes), can be used to compress an integer x representing the difference as a series of k-bit blocks.

Figure 1A:
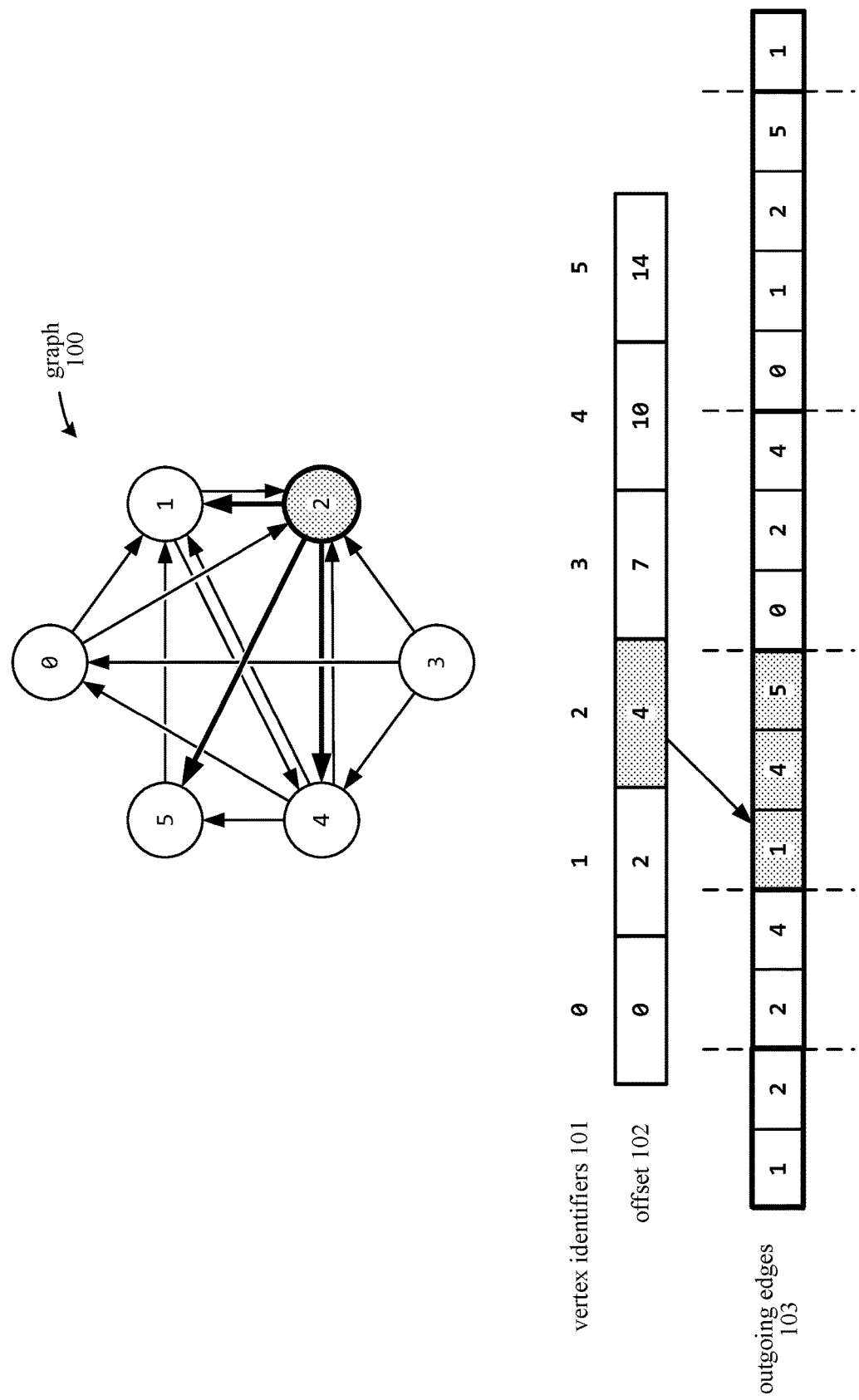
FIG. 1A illustrates an unencoded graph dataset, according to an embodiment.

FIG. 1A illustrates an example of a graph 100 with six vertices having vertex identifiers 101 from 0 to 5. Each vertex is connected with other vertices using incoming and outgoing edges which are represented using an incoming edge array and an outgoing edge array 103, respectively. The example illustrates how the outgoing edge array 103 is represented, however, the same approach is applicable to an incoming edge array. An offset array 102 is used to represent the starting index of each vertex in the outgoing edge array 103. For example, the value '4' at an index position in the offset array 102 corresponding to vertex 2 indicates that the outgoing edges for vertex 2 are stored in the outgoing edge array 103 starting from the index 4 position. Thus, vertex 2 is connected via an outgoing edge to vertices 1, 4, and 5.

Table 1 shows one approach for performing difference encoding of graph data. If an edge to be encoded is the first edge for a given vertex in the outgoing edges array 103, then the edge is encoded as a difference between the edge value $v_i$ (i.e., the identifier of the destination vertex) and the subject vertex value v (Line 6). Otherwise, the edge is encoded as the difference between the current edge value and the previous edge value (Line 8).

TABLE 1

| Difference Encoding |
|---|
| Input: Number of graph vertices V, vertices data, and edge data to encode. |
| Output: The encoded edge data. |
| 1    for each vertex v, where v = 0, 1, ..., V−1 do |
| 2        Get vertex v edges list |
| 3        Sort vertex v edges list |
| 4        for each edge $v_i$, where i = 0, 1, ..., deg(v) do |
| 5            if (i == 0) then |
| 6                $v_i = v_i - v$ |
| 7            else |
| 8                $v_i = v_i - v_{i-1}$ |

TABLE 1-continued

Difference Encoding

```
9       end
10     end
11   end
```

Table 2 shows the corresponding approach for decoding the encoded edge data. If the edge is the first edge for a given vertex in the encoded outgoing edges array 103, then the decoded value is the sum of the edge value $v_i$ and the subject vertex value v (Line 5). Otherwise, the decoded value is the sum of the edge value $v_i$ and the previous edge $v_{i-1}$ (Line 7).

TABLE 2

Difference Decoding

Input: Number of graph vertices V, vertices data, and encoded edge data to decode.
Output: The decoded edge data.
```
1   for each vertex v, where v = 0, 1, ..., V-1 do
2       Get vertex v edges list
3       for each edge v_i, where i = 0, 1, ..., deg(v) do
4           if (i == 0) then
5               v_i = v_i + v
6           else
7               v_i = v_i + v_{i-1}
8           end
9       end
10  end
```

Figure 1B:
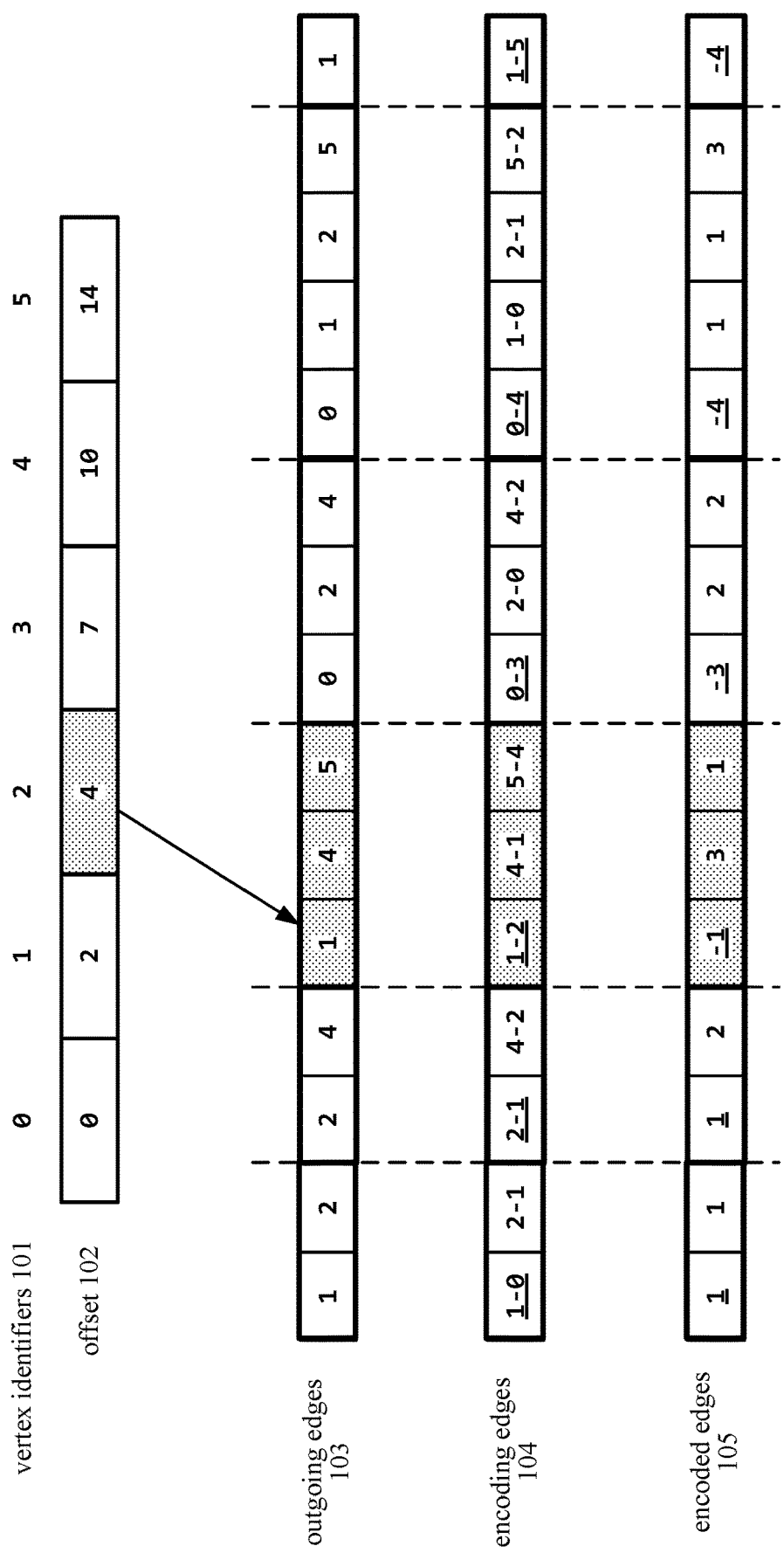
FIG. 1B illustrates difference encoding of a graph dataset, according to an embodiment.

FIG. 1B illustrates the difference encoding process as performed on the example in FIG. 1A. The first edge for each vertex is encoded as the difference between the edge value and the vertex value. For example, the first edge from the subject vertex 2 is 1, located at index 4 in the original outgoing edge array. This edge value is encoded as (1−2=−1), where 1 is the edge value and 2 is the identifier of the subject vertex. The second edge for subject vertex 2 is encoded as (4−1=3), where 4 is the second edge value and 1 is the original value of the first edge. The encoding edges array 104 shows the calculations for encoding each of the edge values in the original outgoing edges array 103. The resulting encoded edge values are shown in the encoded edges array 105. In the arrays 104 and 105, the underlined values are located at index positions that are referenced by the offset values, and are therefore calculated using their respective subject vertex identifiers.

Figure 1C:
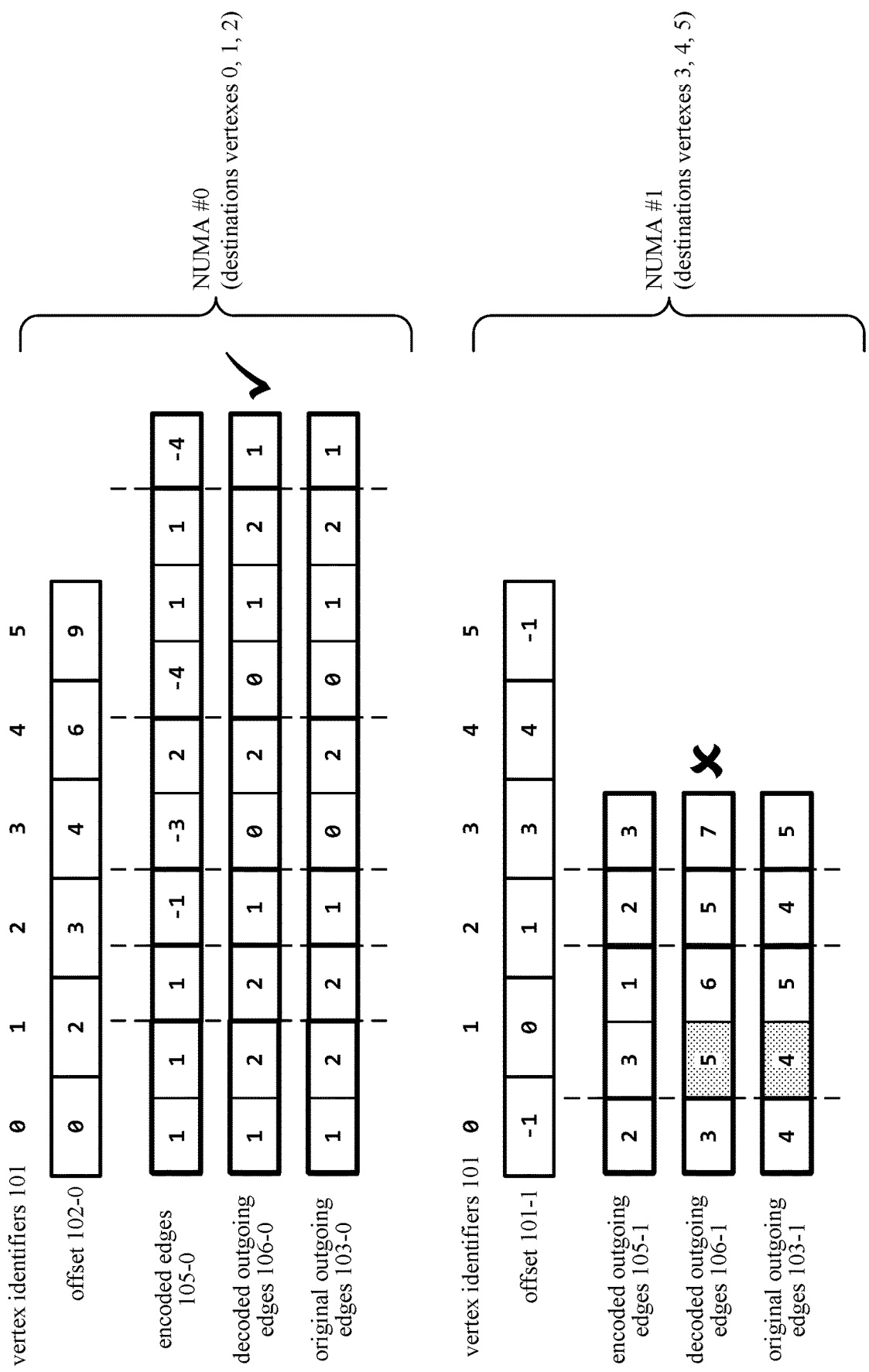
FIG. 1C illustrates error in decoding of a graph dataset, according to an embodiment.

FIG. 1C shows an example where the encoded graph dataset is distributed between two non-uniform memory access (NUMA) nodes (e.g., in a distributed computing system). In this example, computations for a subject vertex are conducted on edges stored in the local NUMA node, and replicas of the subject vertex in other NUMA nodes are used to initiate the computation for other edges.

In the illustrated example, the first NUMA node (NUMA #0) is assigned edges connecting to vertices 0, 1, and 2. Edges to the remaining vertices (3, 4, and 5) are assigned to the second NUMA node (NUMA #1). The encoded values from FIG. 1B are distributed according to this mapping; thus, NUMA #0 stores the offset values 102-0 and encoded edges 105-0 while NUMA #1 stores the offset values 102-1 and encoded edges 105-1. A '−1' value in the offset array (e.g., positions 0 and 5 in offset array 101-1) indicates that no edges for the corresponding subject vertex are represented in the NUMA node.

The decoding process is performed according to Table 2. On node NUMA #0, the decoding generates the correct values in the decoded outgoing edges array 106-0, which match the original outgoing edges 103-0 for the NUMA #0 node. However, correctly decoding the edge values 105-1 at node NUMA #1 entails obtaining decoded edge values from NUMA #0. For example, for vertex 2 on NUMA #1, the first encoded edge 3 is decoded using the value of the first edge from NUMA #0 to be able to correctly decode the edge value as '4' (based on 3+1=4). Such a remote access in the NUMA system is expensive as it incurs long latency and consumes the limited bandwidth between the NUMA nodes.

On the other hand, directly applying the decoding process in NUMA #1 without communicating with NUMA #0 leads to incorrect decoded values as shown in the decoded outgoing edges array 106-1. For example, for the subject vertex 2 on NUMA #1, the first encoded edge having a value of 3 is assumed to be the first edge for the subject vertex 2, and is thus decoded as the sum of the edge value and the vertex value (i.e., 3+2=5), which differs from the original outgoing edge array 103-1 value of '4'. Accordingly, the above encoding and decoding approach is either expensive due to remote accesses or leads to incorrect decoding (if no remote accesses are used) when the graph dataset is distributed across multiple nodes (e.g., NUMA nodes) in a distributed computing system.

In one embodiment, a technique for encoding a graph dataset across multiple computing nodes in a distributed computing system removes the need for remote accesses while decoding by taking into consideration how vertices and edges are distributed among the multiple computing nodes. Such a distributed-system-aware scheme enables correct difference encoding and decoding on a distributed system without the need for remote communication. In one embodiment, a distributed-system-aware difference encoding scheme is able to perform difference encoding of graph data whether the number of distributed nodes is known or unknown. In one embodiment, the encoded values are represented using different variable length codes that affect the compression ratio and the decoding time.

Figure 2:
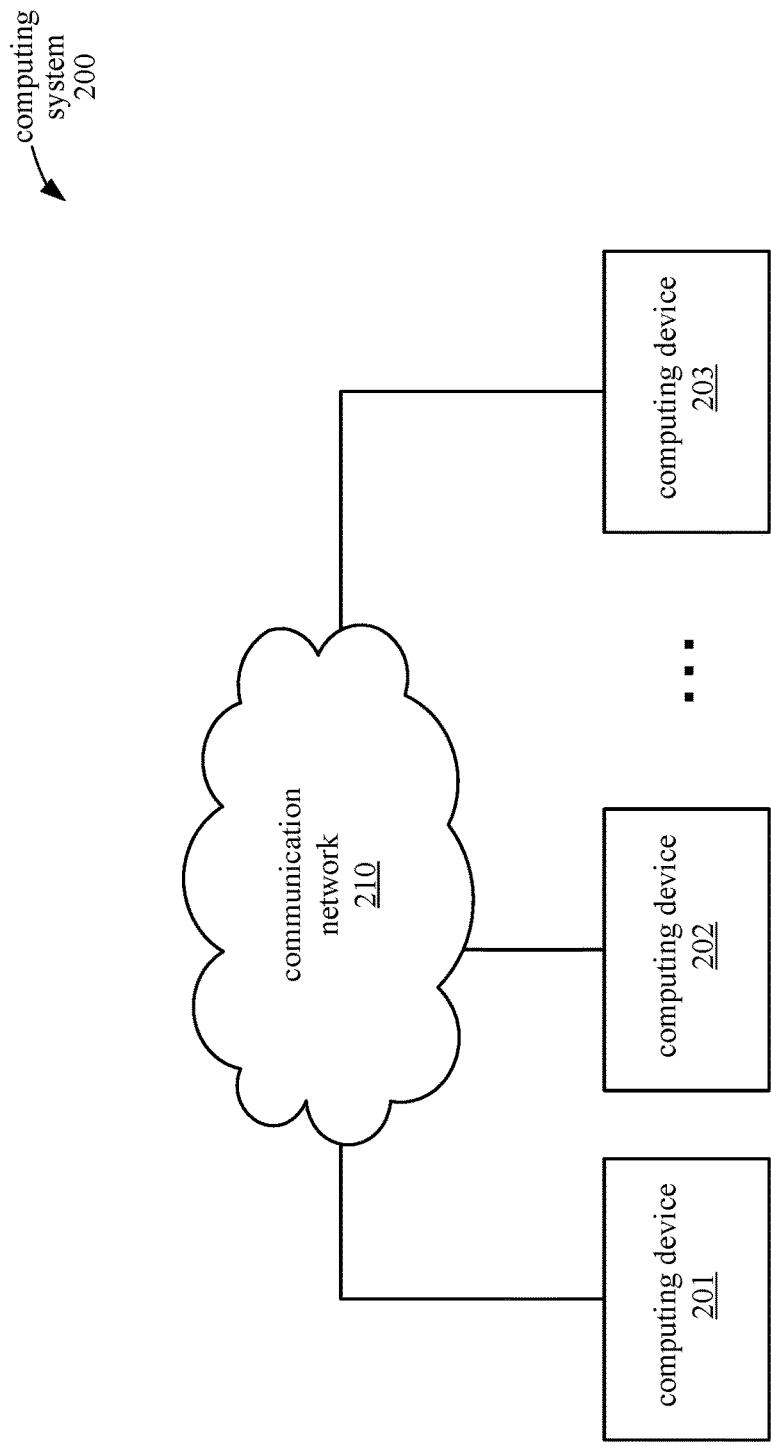
FIG. 2 illustrates an embodiment of a distributed computing system.

FIG. 2 illustrates an embodiment of a distributed computing system 200 in which the graph encoding and decoding scheme is implemented. Computing system 200 includes multiple computing devices 201-203 (e.g., NUMA nodes, servers, mobile devices, etc.) that are connected to each other via a communication network 210. Each of the computing devices 201-203 has processing and memory storage capabilities. In one embodiment, the computing system 200 is contained within a single physical enclosure, and the communication network 210 is a bus or system interconnect connecting the computing devices 201-203 within the enclosure. For example, the computing devices 201-203 can include processing units such as graphics processing units (GPUs), central processing units (CPUs), field programmable gate arrays (FPGAs), etc. on the same board or on separate carrier boards that are connected to each other via a backplane. In one embodiment, the components in the computing system 200 are contained in separate physical enclosures and are geographically distributed. For example, the computing devices 201-203 can represent individual servers, personal computers, mobile devices, etc. that are connected to each other via a wide-area network (WAN) such as the Internet, a local-area network (LAN), wireless network, or other communication network 210. In one embodiment, the computing devices 201-203 represent the same type or similar types of devices; alternatively, the computing devices 201-203 are different types of devices.

Figure 3:
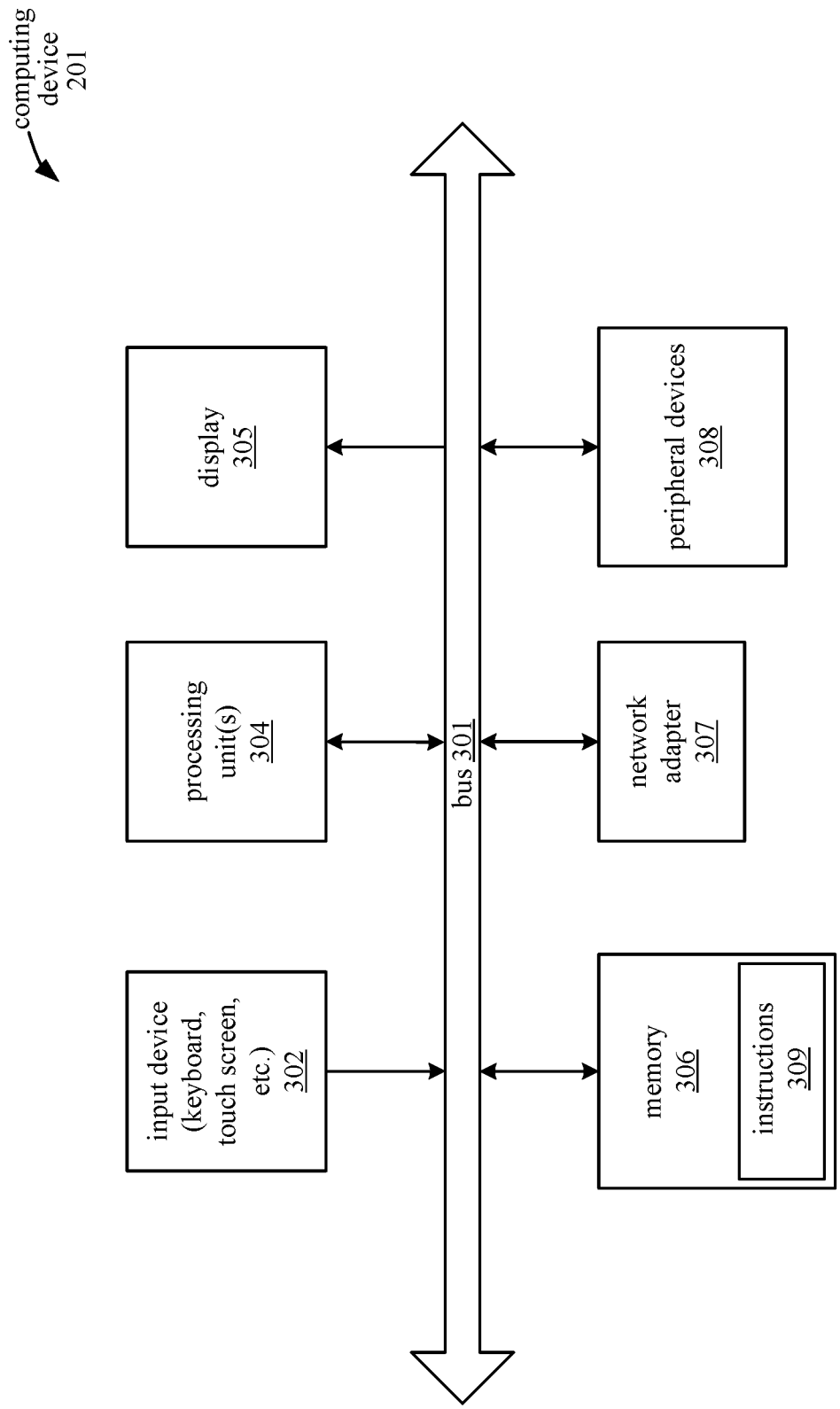
FIG. 3 illustrates a computing device, according to an embodiment.

FIG. 3 illustrates an embodiment of a computing device 201 in which the graph encoding and decoding scheme is implemented. In general, the computing device 201 is embodied as any of a number of different types of devices, including but not limited to a laptop or desktop computer, mobile device, server, etc. The computing device 201 includes a number of components 302-308 that communicate with each other through a bus 301. In computing device 201, each of the components 302-308 is capable of communicating with any of the other components 302-308 either directly through the bus 301, or via one or more of the other components 302-308. The components 301-308 in computing device 201 are contained within a single physical enclosure, such as a laptop or desktop chassis, or a mobile phone casing. In alternative embodiments, some of the components of computing device 201 are embodied as peripheral devices such that the entire computing device 201 does not reside within a single physical enclosure.

The computing device 201 also includes user interface devices for receiving information from or providing information to a user. Specifically, the computing device 201 includes an input device 302, such as a keyboard, mouse, touch-screen, or other device for receiving information from the user. The computing device 201 displays information to the user via a display 305, such as a monitor, light-emitting diode (LED) display, liquid crystal display, or other output device.

Computing device 201 additionally includes a network adapter 307 for transmitting and receiving data over a wired or wireless network. Computing device 201 also includes one or more peripheral devices 308. The peripheral devices 308 may include mass storage devices, location detection devices, sensors, input devices, or other types of devices used by the computing device 201.

Computing device 201 includes one or more processing units 304, which in the case of multiple processing units 304 are capable of operating in parallel. The processing unit(s) 304 are configured to receive and execute instructions 309 that are stored in the memory subsystem 306. In one embodiment, each of the processing unit(s) 304 includes multiple processing cores that reside on a common integrated circuit substrate. Memory subsystem 306 includes memory devices used by the computing device 201, such as random-access memory (RAM) modules, read-only memory (ROM) modules, hard disks, and other non-transitory computer-readable media.

Some embodiments of computing device 201 may include fewer or more components than the embodiment as illustrated in FIG. 3. For example, certain embodiments are implemented without any display 305 or input devices 302. Other embodiments have more than one of a particular component; for example, an embodiment of computing device 201 could have multiple buses 301, network adapters 307, memory devices 306, etc.

Figure 4:
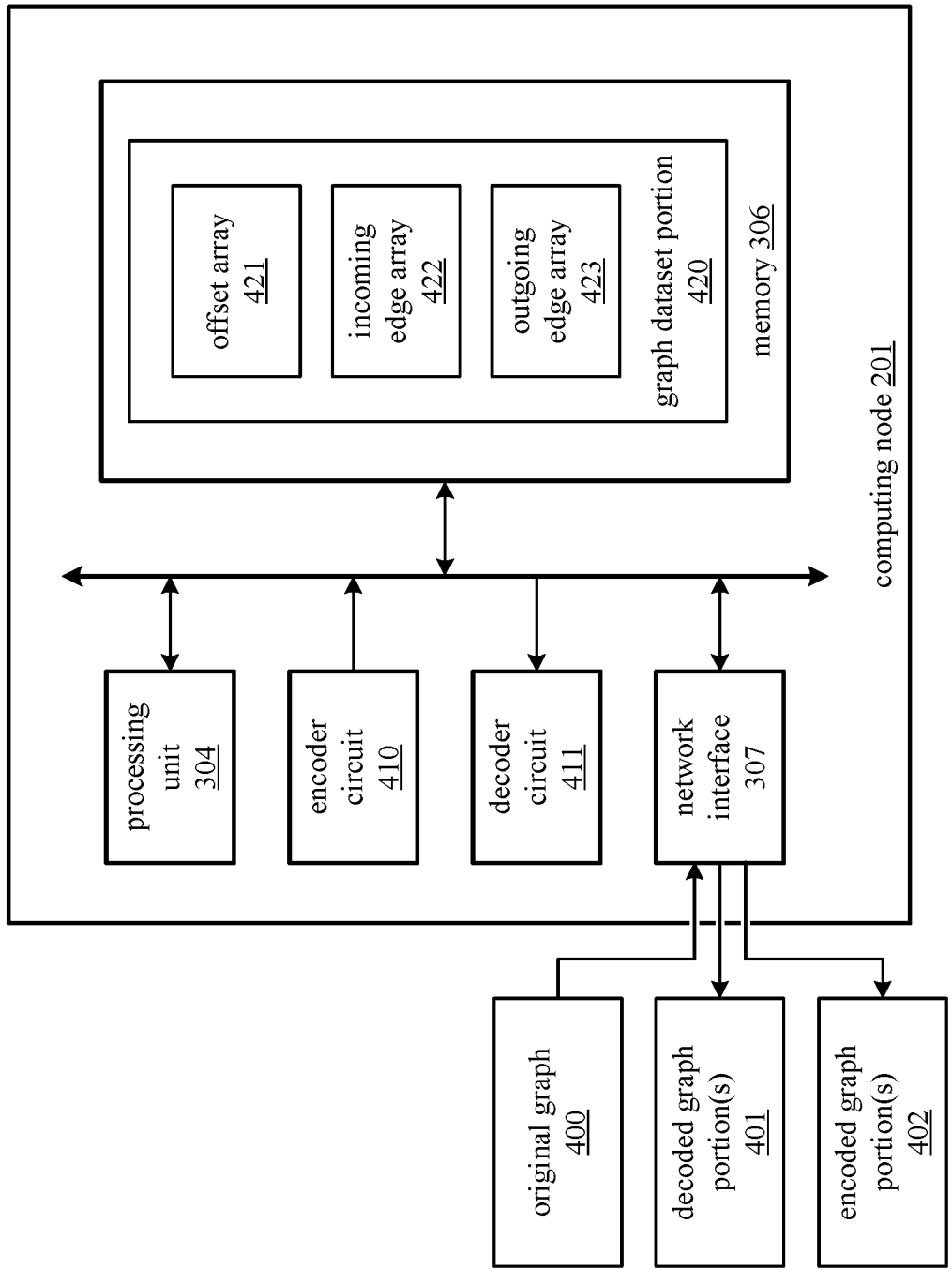
FIG. 4 illustrates circuitry for performing difference encoding of a graph in a computing device, according to an embodiment.

FIG. 4 is a block diagram illustrating hardware components of a computing device 201 operating as a node in a distributed computing system 200, according to an embodiment. The computing node 201 includes hardware and software and/or firmware for encoding a portion of the original graph data 400, storing the encoded portion, and decoding the encoded graph dataset portion 420. In one embodiment, other computing nodes in the distributed computing system 200 include similar components that similarly encode and decode their own respective portions of the graph data. In one embodiment, the computing node 201 encodes only the portion of the graph dataset 420 that is stored in the computing node 201. In alternative embodiments, the computing node 201 encodes the entire graph dataset and distributes encoded portions of the graph dataset to the other computing nodes 202-203 in the distributed computing system 200.

As illustrated in FIG. 4, the original unencoded graph data 400 is received via the network interface 307; however, in alternative embodiments, the graph data 400 can be received from storage media, input from a user, etc. In one embodiment, the original graph data 400 is provided in a format as described with reference to FIG. 1A. The encoder circuit 410 has an input coupled to receive the original graph data 400 and, based on the original graph data 400, generate a portion 420 of the graph dataset.

For each of the subject vertices represented in the graph data 400, the encoder circuit 410 calculates an encoded edge value for each of the edges connected to the subject vertex, including incoming edges and outgoing edges. For an outgoing edge, the subject vertex is an origin vertex and the connected vertex is a destination vertex. For an incoming edge, the connected vertex is an origin vertex and the subject vertex is a destination vertex. In the original graph data 400, each edge is represented by an identifier of the connected vertex (either an origin or destination vertex) connected to the subject vertex.

Depending on the distribution of the graph data among the computing nodes 201-203 in the distributed computing system 200, edge values are assigned to different index positions in the edge arrays 422 and 423 of each computing node. In one embodiment, each of the computing nodes is assigned to store edge values corresponding to a subset of the connected vertices. Based on this distribution mapping, the encoder circuit 410 calculates an offset array for each of the edge arrays 422 and 423. The offset array includes an offset value for each subject vertex in the graph, and the offset value indicates a position in the corresponding edge array 422 or 423 where the first edge value associated with the subject vertex is stored. The offset arrays are calculated for the portion 420 of the graph dataset to be stored in computing node 201, and for any other portions of the graph dataset being encoded for other nodes.

For each of the edges assigned to the computing node 201, the encoding circuit 410 calculates an encoded edge value based on the connected vertex identifier representing the edge in the original graph data 400. When the edge value is assigned to a first position for the subject vertex in the edge array (i.e., the position referenced by the offset value for the subject vertex), the edge value is encoded according to a first calculation, in which the encoder circuit 410 calculates a difference between the connected vertex identifier and the vertex identifier of the subject vertex. The resulting difference value is used to represent the edge in the appropriate edge array 422 or 423.

When the edge value is assigned to a subsequent position (i.e., having a higher index than the position referenced by the offset for the subject vertex), then the encoded edge value is determined based on a second calculation. The encoder circuit 410 performs the second calculation by calculating a difference between the connected vertex identifier and an original unencoded vertex identifier representing a prior edge of the subject vertex, which is encoded at a prior adjacent position in the same edge array as the edge value being encoded.

The encoder circuit 410 is connected to a memory interface of the memory 306, through which it records the encoded portion 420 of the graph dataset. For each subject vertex in the graph, the offset for the subject vertex determined by the encoder circuit 410 is recorded in an offset array 421 in the memory 306. For each subject vertex, the encoded edge value for each edge connected with the subject vertex is recorded in the edge arrays 422 and 423. Values for incoming edges for the subject vertex are recorded in the incoming edge array 422, while values for outgoing edges are recorded in the outgoing edge array 423. In one embodiment, encoded graph data 402 is transmitted via network interface 307 to one or more other computing nodes 202-203 in the distributed computing system 200 instead of or in addition to being stored in the memory 306.

The decoder circuit 411 is connected to the memory interface of memory 306 and reads the encoded edge values from the memory 306 via the memory interface. For each subject vertex in the graph, the decoder circuit 411 decodes each of the encoded edge values associated with the subject vertex. When the encoded edge value is in the first position of the edge array (i.e., referenced by the offset for the subject vertex), the decoder circuit 411 decodes the encoded edge value by adding the encoded edge value to the identifier of the subject vertex. When the edge value is in another position in the edge array subsequent to the first position, the decoder circuit 411 decodes the encoded edge value by adding the edge value to the identifier of a prior vertex. In one embodiment, the prior vertex identifier identifies another vertex that is also connected to the subject vertex (e.g., the vertex identifier calculated by decoding the most recently decoded edge value for the subject vertex).

In one embodiment, the decoded edge values are provided to the processing unit 304 and used to perform graph analytics computations in the processing unit 304 within the computing node 201 itself. Alternatively, the decoded edge values are provided to other computing nodes 202-203 in the system 200 via the network interface 307. In one embodiment, the computing node 201 decodes some or all of its portion 420 of the graph and provides the decoded graph portion 401, including the decoded edge values, to one or more other computing nodes 202-203. Computations can then be carried out in the recipient computing nodes based on the received decoded graph portions 401.

In one embodiment, the processing unit 304 is also capable of performing the functions of the encoder 410 and decoder 411, and supports an instruction set that includes encode and decode instructions for encoding and decoding a graph. In one embodiment, the encoder circuit 410 and decoder circuit 411 exist as dedicated hardware blocks residing within the processing unit 304 (i.e., on the same die, within the same device package, etc.).

In one embodiment, the processing unit 304 also distributes the graph data among the multiple computing nodes 201-203. For each of the computing nodes 201-203 in the system 200, the processing unit 304 assigns a subset of the vertices in the graph to the computing node. For each subject vertex in the graph, each computing node stores only the edges connecting the subject vertex to the vertices in its assigned subset. In one embodiment, encoded portions 402 of the graph are transmitted via the network interface 307 to other computing nodes 202-203 to which they are assigned in the system 200.

Table 3 shows pseudo code for performing distributed-system-aware difference encoding of graph data, according to an embodiment. The process represented in the pseudo code in Table 3 is performed by the encoder circuit 410, or by the processing unit 304 executing instructions. As shown in lines 4, 6, and 7, the encoding process determines whether a current edge being encoded is the first edge in a computing node (e.g., a NUMA node) for the subject vertex. If so, the edge is encoded as the difference between the edge value (i.e., the identifier of the connected vertex) and the subject vertex identifier value, as shown in line 10. Otherwise, the edge is encoded as the difference between the edge value and the previous edge value (i.e., the original value of the most recently encoded edge value), as shown in line 8.

TABLE 3

Distributed System-Aware Difference Encoding

Input: Number of computing nodes Z, number of graph vertices V, vertices data, and edge data to encode.
Output: The encoded edge data.
```
 1    for each vertex v, where v = 0, 1, ..., V-1 do
 2        Get vertex v edges list
 3        Sort vertex v edges list
 4        Define the previous node Yprevious, Yprevious = -1
 5        for each edge v_i, where i = 0, 1, ..., deg(v) do
 6            Get the current edge node mapping, Y = getEdgeMapping(v_i)
 7            if (Y == Yprevious) then
 8                v_i = v_i - v_{i-1}
 9            else
10                v_i = v_i - v
11            end
12            Yprevious = Y
13        end
14    end
```

Figure 5A:
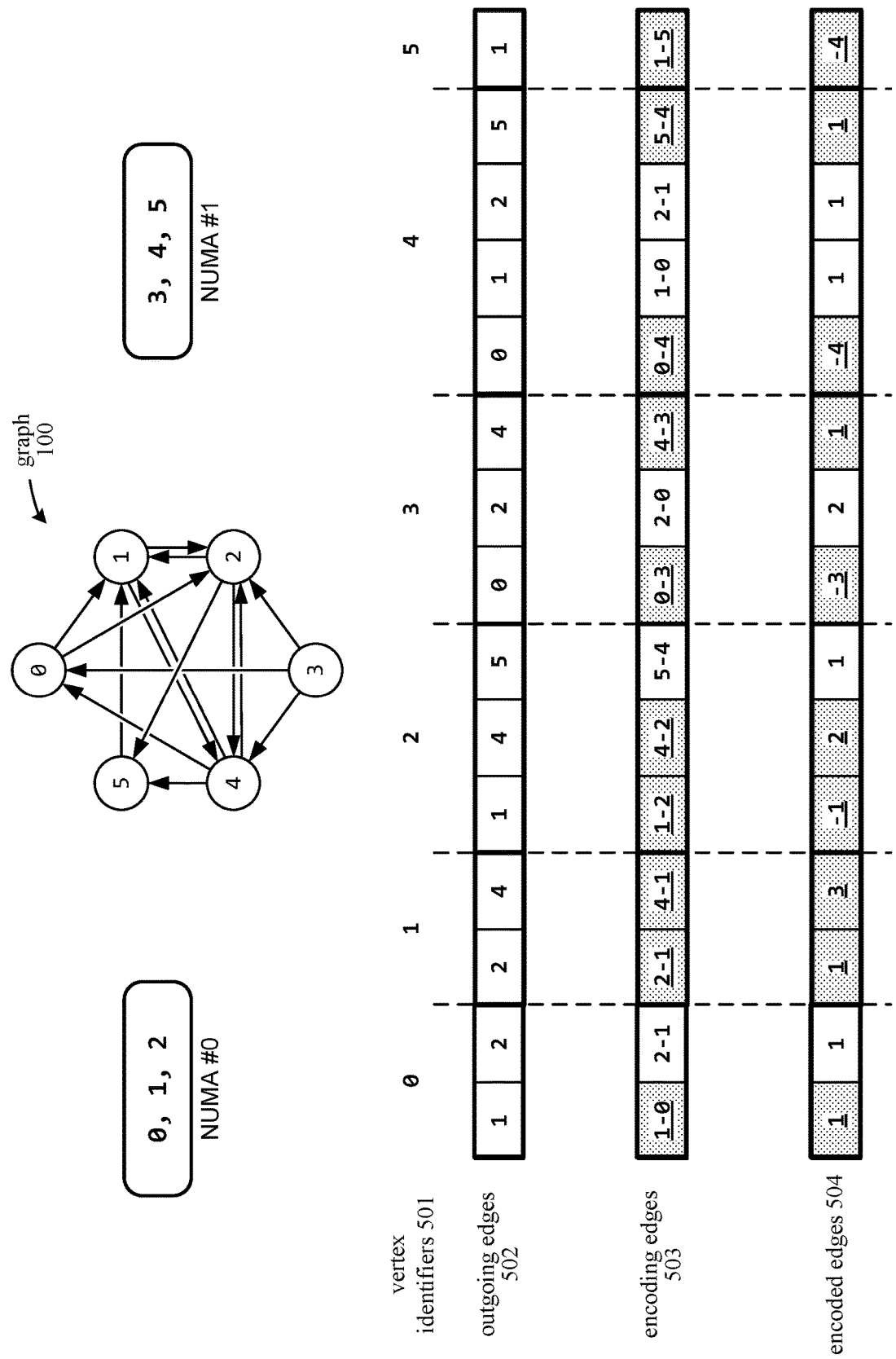
FIG. 5A illustrates distributed-system-aware difference encoding of a graph, according to an embodiment.

FIG. 5A illustrates the application of this encoding process to the graph 100, according to an embodiment. In FIG. 5A, the vertex identifiers 501 include the identifiers for each of the subject vertices in the graph 100, and the outgoing edges array 502 includes unencoded edge values representing the outgoing edges connected to each subject vertex.

Each outgoing edge is represented in the edge array 502 by the identifier of the destination vertex connected by the edge.

According to the example in FIG. 5A, the first edge value '1' for subject vertex is assigned to node NUMA #0, while edges 4 and 5 are assigned to node NUMA #1. Since edge 4 is assigned to be the first edge of subject vertex 2 on NUMA #1, then edge 4 is encoded as the difference between the edge value '4' and the subject vertex value '2'; thus, the resulting encoded value is '2'. Edge 5 is the not the first edge of subject vertex 2 on NUMA #1, and is therefore encoded as the difference between its own value '5' and the unencoded edge value '4' of the previous edge. The resulting encoded value is '1'.

The encoding edges array 503 shows the respective calculations performed for encoding each of the original outgoing edge values 502. The resulting encoded edge values are shown in the encoded edges array 504. In the encoding edges array 503 and the encoded edges array 504, shaded values indicate that the value is the first edge on a particular node that is associated with the subject vertex.

In line 6 of Table 3, the function getEdgeMapping( ) returns the mapping of a given edge to a computing node in the system. That, is, given the edge value, the getEdgeMapping( ) function returns the number of the computing node in which the edge value is assigned to be stored. The getEdgeMapping( ) function can be implemented for any arbitrary mapping. In the example shown, uniform partitioning is used, in which edge values are distributed as evenly as possible among the computing nodes.

Decoding of the encoded values is performed in the same manner as shown in Table 2. Specifically, if the edge is the first edge on a computing node for a given subject vertex, then the edge is decoded as by summing the encoded edge value and the subject vertex value. Otherwise, the encoded edge value is decoded by summing the encoded edge value and the value of the previous edge (i.e., the most recently decoded edge value) on the same computing node.

Figure 5B:
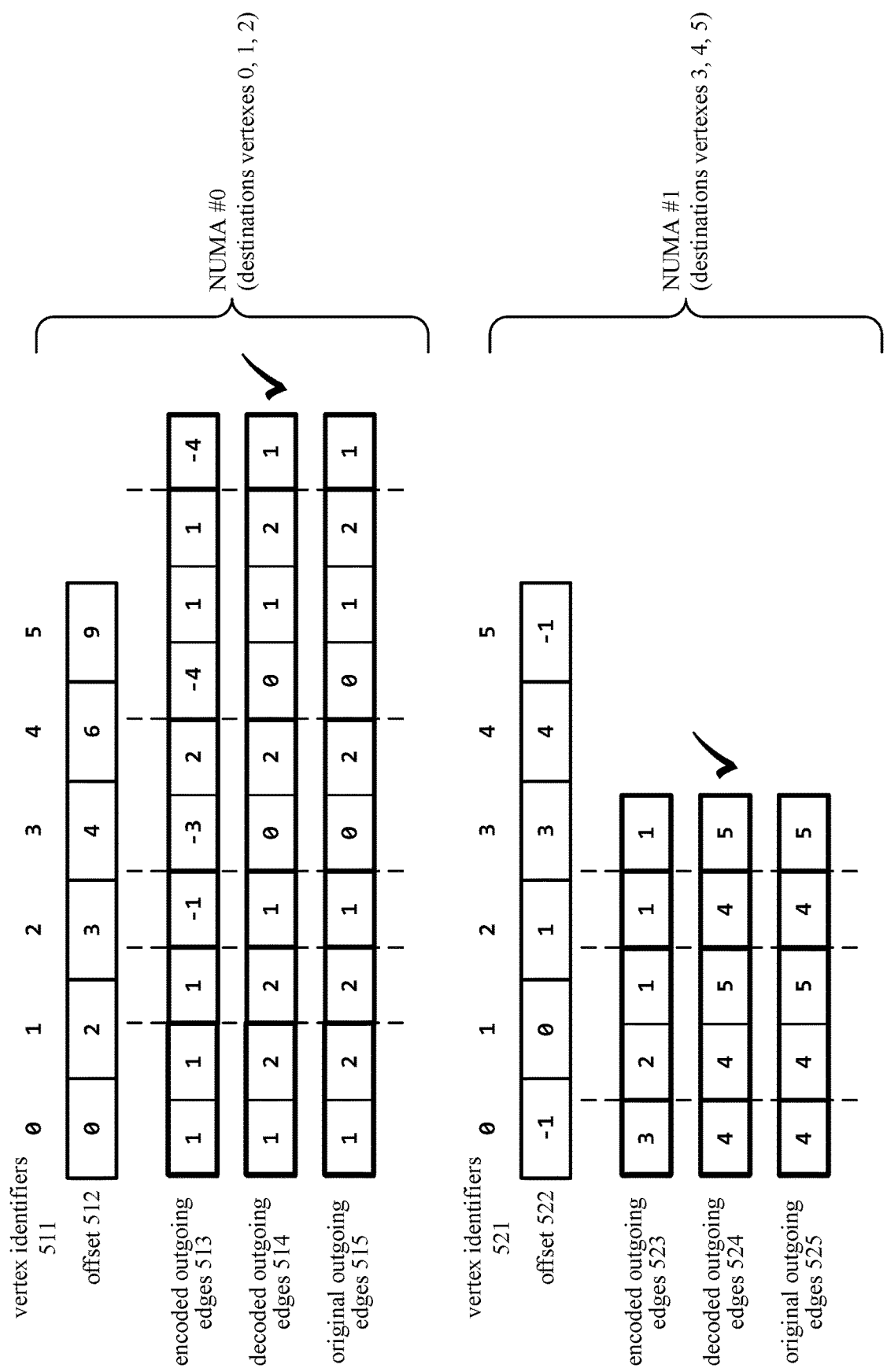
FIG. 5B illustrates correct decoding of a distributed-system-aware encoded graph dataset, according to an embodiment.

FIG. 5B shows the portions of the encoded graph data that are stored in the nodes NUMA #0 and NUMA #1, according to an embodiment. Each of the nodes NUMA #0 and NUMA #1 is assigned a different subset of vertices; NUMA #0 stores values representing edges connected to destination vertices 0, 1, and 2, while NUMA #1 stores values representing edges connected to destination vertices 3, 4, and 5. Thus, for each subject vertex, each node stores a different subset of edge values representing edges connected to the subject vertex. When a node stores no edges connected to a subject vertex, the offset associated with the subject vertex is set to '−1'. For example, NUMA #1 does not store any edge values for the subject vertex 0 because vertex 0 has no outgoing edges to any of the vertices 3, 4, and 5 assigned to NUMA #1; accordingly, the offset value for vertex 0 is set to '−1' in the offsets array 522. As a result, the edge arrays in the different computing nodes can include a different number of edge values for the same subject vertex.

In node NUMA #0, the vertex identifiers 511 identify the subject vertices in the graph 100, and the offsets array 512 includes an offset value for each subject vertex. Each offset value refers to a position in the edge arrays 513-515 of the first edge value for the corresponding subject vertex. In node NUMA #1, the vertex identifiers 521 identify the subject vertices in the graph 100, and the offsets array 522 includes an offset value for each subject vertex. Each offset value refers to a position in the edge arrays 523-525 of the first edge value for the corresponding subject vertex.

FIG. 5B shows that when using the distributed-system-aware difference encoding, the edge values in all of the computing nodes NUMA #0 and NUMA #1 are decoded correctly. That is, the decoded outgoing edges 514 are equal to the original unencoded outgoing edges 515 in NUMA #0 and the decoded outgoing edges 524 are equal to the original unencoded outgoing edges 525 in NUMA #1. Furthermore, the correct decoding is performed without the use of remote accesses to transfer data between nodes.

Figure 6A:
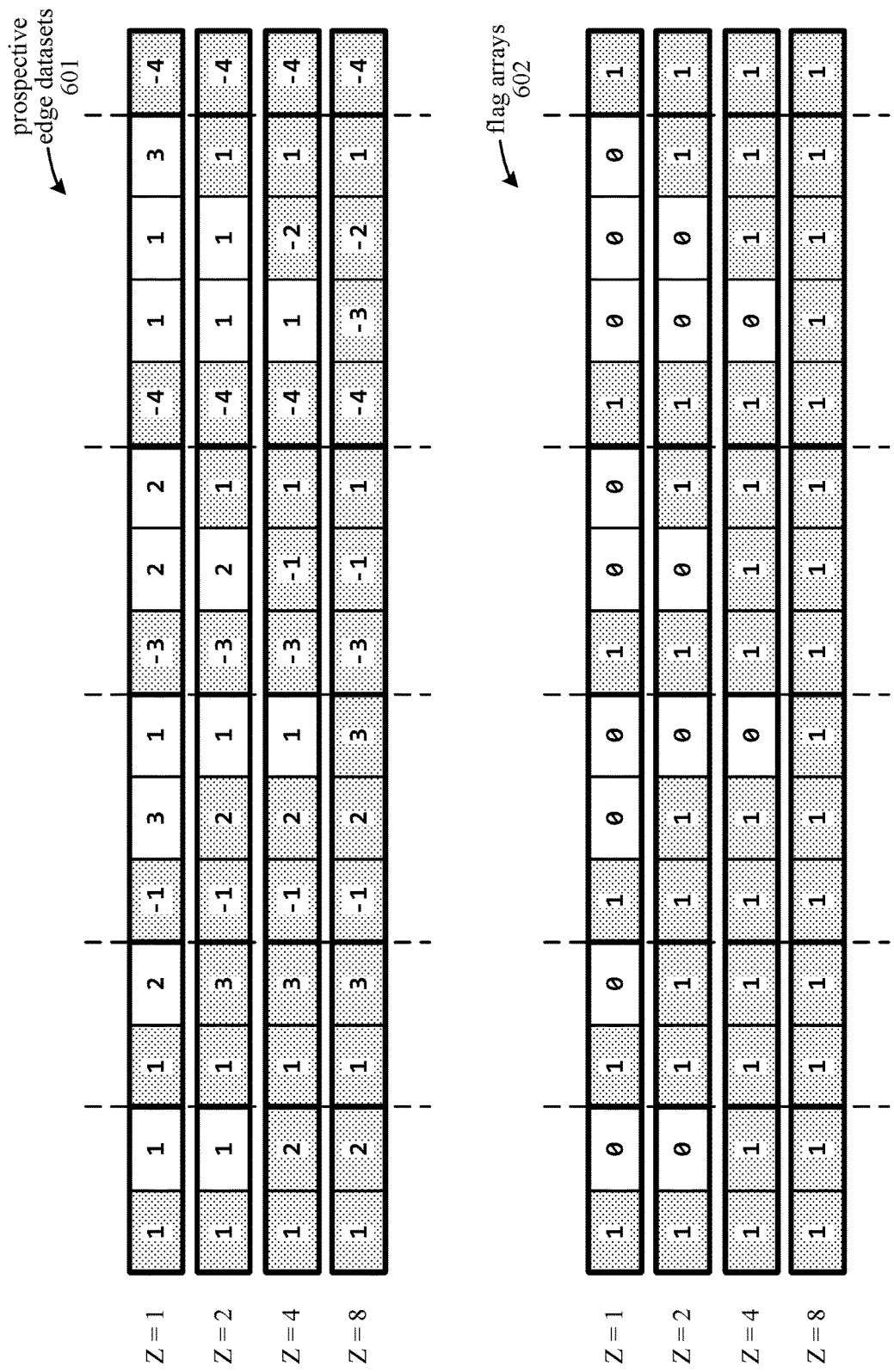
FIGS. 6A, 6B, and 6C illustrate data structures generated in the process of encoding a graph dataset, according to an embodiment.
Figure 6B:
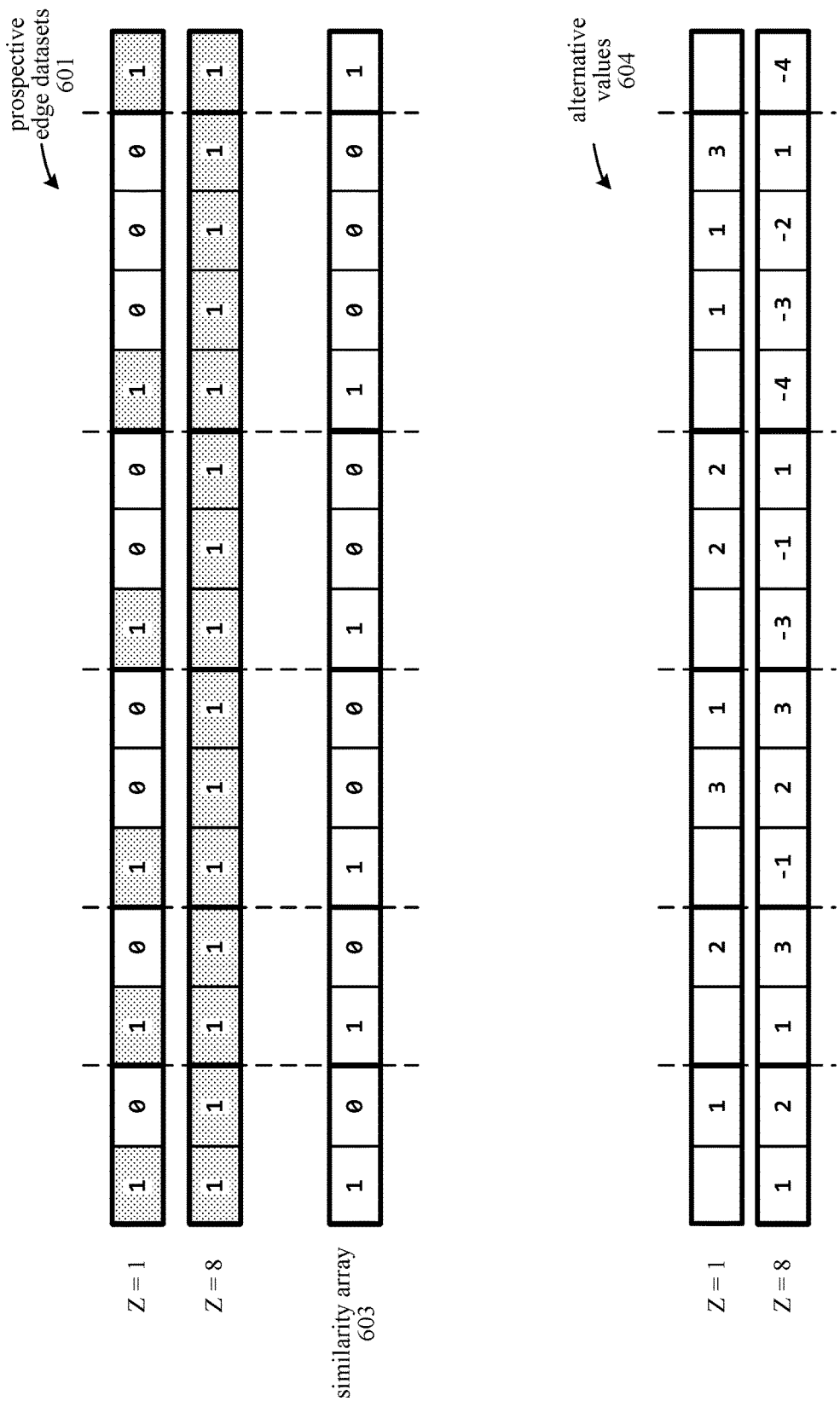
Figure 6C:
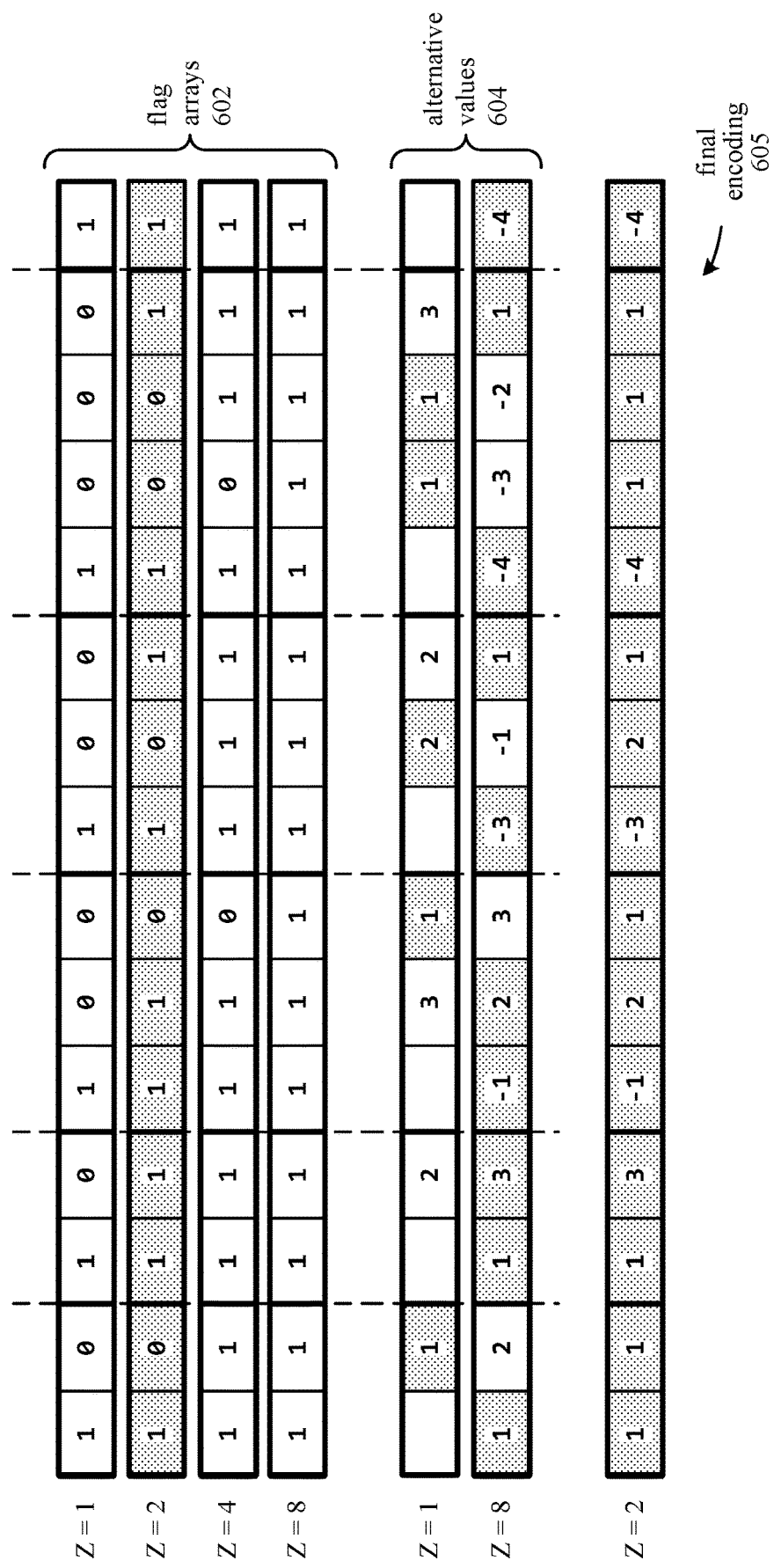

The above encoding process works when the number of distributed computing nodes is known; however, in some cases, the topology of the distributed computing system (and thus the number of nodes) is not known at the time of the encoding. FIGS. 6A, 6B, and 6C illustrate data structures generated in the course of encoding graph data according to an embodiment of a distributed-system-aware difference encoding process when the number of distributed nodes is constrained, but not known. This encoding process is performed in the encoder circuit 410, and generates data that can be subsequently used to generate a final encoded dataset to be distributed to the computing nodes when the number of nodes becomes known.

In the example illustrated in FIGS. 6A-6C, the number of computing nodes (e.g., NUMA nodes) is unknown; however, the maximum possible number of nodes is known, and the number of nodes is a multiple of two. As illustrated in FIG. 6A, Z represents the number of nodes in the distributed computing system. In this case, the difference encoding supports a maximum of eight nodes (Zmax=8) and a minimum number of one node (Zmin=1). Accordingly, the presently unknown final value of Z will be either 1, 2, 4, or 8. The prospective edge datasets 601 include a set of edge values for each of the possible values of Z which is calculated according to the difference encoding scheme previously described with respect to FIGS. 5A and 5B. In the prospective edge datasets 601, the shaded values represent values that would be assigned as a first value for a subject vertex in its computing node.

The encoded edge arrays are used to create a set of flag arrays 602, with a flag array for each of the possible values of Z. For each of the possible topologies Z=1 to Z=8, the flag array for the topology includes a flag corresponding to each position in the edge array for the topology. Each flag is asserted when its corresponding edge dataset position is a first position for its subject vertex in its assigned node (i.e., the position is referenced by the offset value for the subject vertex in the node). Otherwise, the flag is deasserted.

A similarity array 603 is generated by a bitwise logical XNOR of the flag arrays for the topologies for Zmin and Zmax (i.e., Z=1 and Z=8), as shown in FIG. 6B. In the resulting similarity array 603, each entry is asserted if both of the Z=1 and Z=8 values in their respective edge arrays are the same, and deasserted if these values are different. An edge corresponding to the asserted entry in the similarity array 603 is always in the first position among the edge values associated with its subject vertex on a computing node for all possible values of Z.

The similarity array 603 identifies redundant values in Z=1 and Z=8 prospective edge datasets 601. Accordingly, one copy of each pair of redundant values (i.e., where the Z=1 and Z-8 values are the same and the corresponding entry in the similarity array 603 is asserted) is saved in an alternative values array 604. If the values are not redundant (i.e., the Z=1 and Z=8 values differ and the corresponding similarity array entry is deasserted), then both values are saved in the array 604.

FIG. 6C shows the dataset that is saved, including flag arrays 602 and alternative values 604, which include the unique values in the edge datasets for the minimum and maximum possible numbers of nodes (i.e., Zmin and Zmax). The encoding is finalized using the saved flag arrays 602 and alternative values 604 once the number of computing nodes is known. This data is used to reconstruct the encoded values for any of the possible values of Z, which in the example are 1, 2, 4, and 8. FIG. 6C shows the reconstruction of the edge array for Z=2 (i.e., the distributed computing system includes two computing nodes).

The flag array corresponding to the number of nodes Z=2 (shown as shaded in FIG. 6C) is selected from the flag arrays 602. Each value in the final encoding 605 of the edge array is determined by, based on the flag in the corresponding position in the Z=2 flag array, selecting one of the alternative edge values from the corresponding position in either the Z=1 or Z=8 arrays in the alternative values 604. If the flag is asserted '1', then the value is selected from the Z=8 array. If the flag is deasserted '0', then the value is selected from the Z=1 array. The shaded values in the arrays 604 show which values are selected according to the Z=2 flags.

In one embodiment, the flag arrays 602 and alternative values 604 can be generated offline without access to the topology of the distributed computing system. The reconstructed final encoding 605 is performed once when the number of nodes is known, and the portions of the final encoding 605 are transmitted to their respective computing nodes when the system is online. Subsequently, the encoded data can be decoded as previously described with reference to Table 2. Some embodiments of distributed or NUMA-based graph analytics systems use migration of edges to achieve dynamic load balancing. In case of migration, the graph data is decoded, migrated, and then re-encoded for the affected distributed computing nodes or NUMA nodes.

Figure 7A:
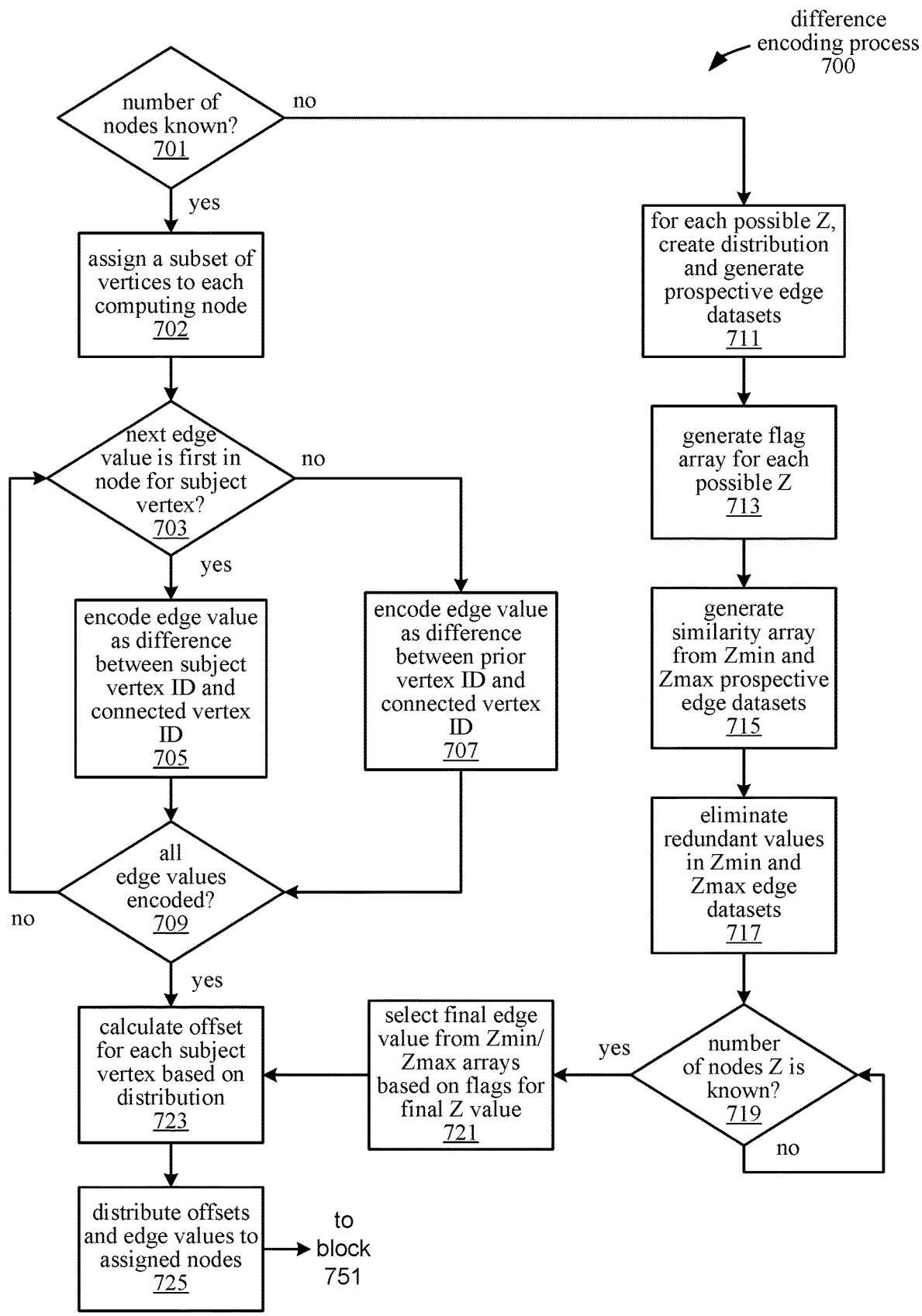
FIG. 7A is a flow diagram illustrating a process for distributed-system-aware difference encoding of a graph dataset, according to an embodiment.
Figure 7B:
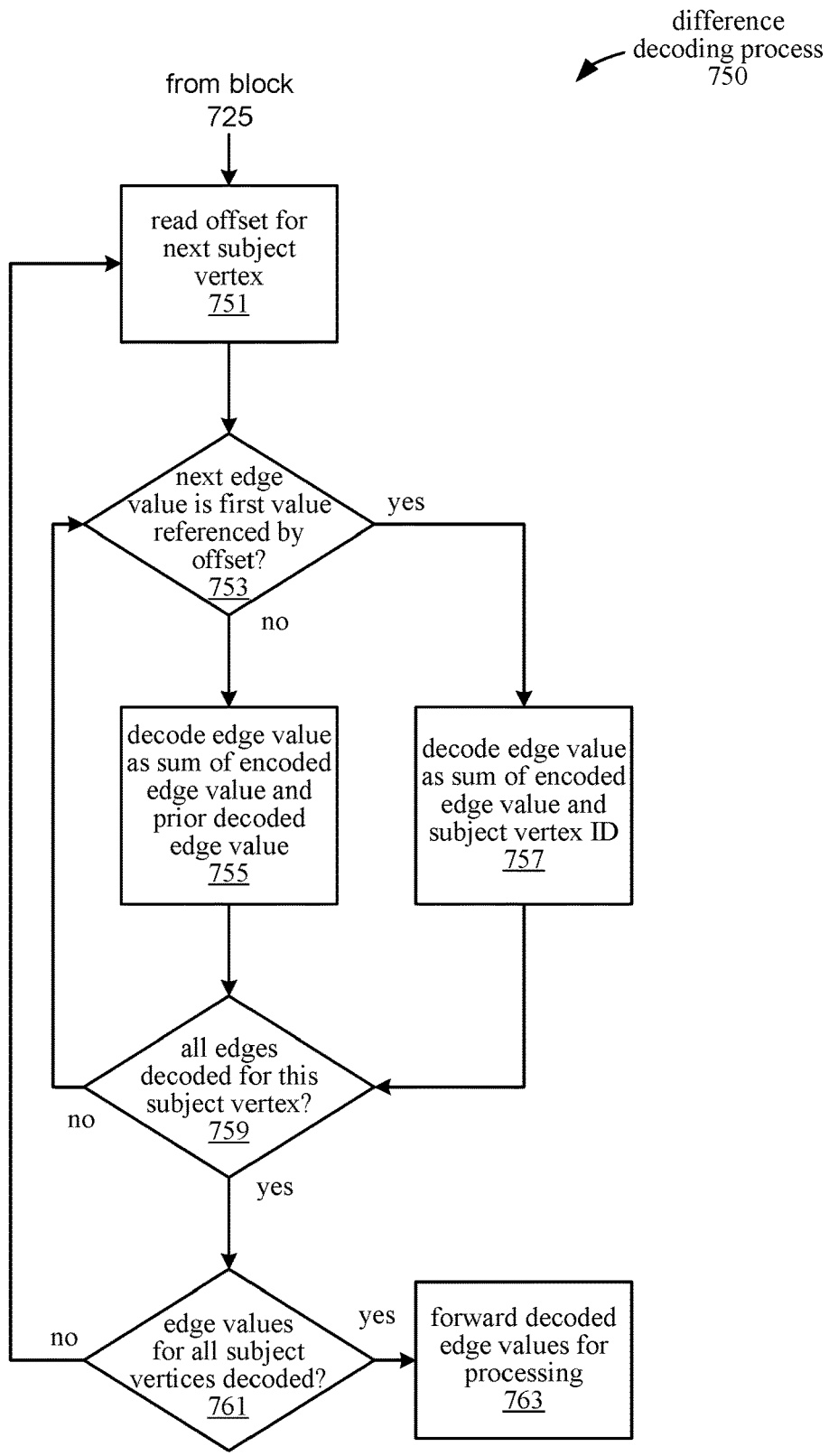
FIG. 7B is a flow diagram illustrating a process for decoding a distributed-system-aware difference encoded graph dataset, according to an embodiment.

FIGS. 7A and 7B illustrate a difference encoding process 700 and a difference decoding process 750, according to an embodiment. The encoding process 700 and decoding process 750 are performed by components in the computing node 201, including the processing unit 304, encoder circuit 410, decoder circuit 411, memory 306, etc. In one embodiment, the operations of processes 700 and 750 are made available to users via a graph processing framework. Such a graph processing framework allows users to develop graph processing applications without worrying about details related to compression, load balancing, etc. In one embodiment, the instruction set architecture (ISA) supported by the processing unit 304 is also updated to include encode and decode instructions that are utilized by a compiler to invoke the processes 700 and 750 when calls to the encode or decode functions are used in the graph processing framework.

In one embodiment, some or all of the processes 700 and 750 are implemented in hardware as a codec engine that includes the encoder circuit 410 and the decoder circuit 411, and performs the encoding, representing encoded values as variable-length codes, and decoding. In such an embodiment, encode and decode instructions are used to enable the codec engine. In an alternative embodiment, encode and decode instructions are broken down into micro-operations supported by existing underlying hardware. In one embodiment the codec engine is implemented as hardware in the processing unit 304. In an alternative embodiment, encoding and decoding of the graph is done via software executed in the processing unit 304.

Difference encoding process 700 begins at block 701. At block 701, if the number Z of computing nodes in the distributed computer system topology is known, the process 700 continues at block 702. At block 702, the process 700 assigns a subset of the vertices in the graph to each of the Z computing nodes, such that each computing node stores, for each subject vertex, values for edges connecting the subject vertex to vertices in its assigned subset. In one embodiment, the distribution is uniform so that the edge values (or alternatively, connected vertices) are distributed as evenly as possible between the computing nodes. From block 702, the process 700 continues at block 703.

By the operations of blocks 703-709, the encoder circuit 410 iterates through each edge value in an unencoded graph dataset 400 to generate an encoded graph dataset 402, which can be distributed in portions to each of the Z computing nodes. At block 703, if the initial or next edge value in the unencoded graph dataset 400 is the first edge value for its subject vertex in the computing node to which it is assigned (e.g., as determined by the getEdgeMapping( ) function), then its encoded edge value is calculated as a difference between the subject vertex identifier and the connected vertex identifier, as provided at block 705. The connected vertex is a destination vertex connected by the edge to the subject vertex (if the edge is an outgoing edge) or an origin vertex of the edge (if the edge is an incoming edge).

At block 703, if the initial or next edge value is not the first edge value for its subject vertex in the computing node to which it is assigned (e.g., the edge value is assigned to a subsequent position in the edge array after the first position), then the encoded edge value is calculated at block 707 as a difference between the unencoded connected vertex identifier and an unencoded prior vertex identifier. The prior vertex identifier is the unencoded value for the edge that was most recently encoded. The prior vertex identifier is encoded in the edge array at a position adjacent to a position of the edge value currently being encoded.

At block 709, if all of the edge values have not yet been encoded, then the process 700 returns to block 703. Blocks 703-709 are thus repeated for each of the edge values to be encoded. At block 709, when all of the edge values have been encoded, the process 700 continues at block 723. At block 723, an offset is calculated for each subject vertex in the graph based on the distribution. In a given computing node, for each subject vertex that has no edge values stored in the computing node, the offset for the subject vertex is set to '-1'. Otherwise, the offset for the subject vertex is set equal to an index of the first edge value associated with the subject vertex in the edge array to be stored in the computing node.

At block 725, the encoded graph dataset portions, including the offsets and encoded edge values, are distributed to their assigned computing nodes according to the distribution previously determined at block 702. In one embodiment, the encoded graph dataset portions are transmitted to other computing nodes via the network interface 307. In each of the recipient computing nodes, the offset values are recorded in an offset array and edge values are recorded in an edge array in a local memory of the computing node. The edge values in the encoded graph dataset are thus distributed among the different computing nodes so that, for a given subject vertex, a first subset of edges connected to the subject vertex is stored in a different computing node than a second subset of edges connected to the subject vertex.

At block 701, if the number of nodes Z in the distributed computing system 200 is not known at the time of the encoding, the process continues from block 701 to block 711. At block 711, the encoder circuit 410 creates, for each possible Z value, a distribution mapping that assigns a different subset of vertices to each of the Z computing nodes. The encoder circuit 410 then generates a prospective edge dataset for each possible value of Z, where each possible value of Z corresponds to a different possible topology of the distributed computing system. For example, the encoder circuit 410 generates the prospective edge datasets 601 for Z=1, 2, 4, and 8. The prospective edge dataset for a given topology includes one or more subsets of edge values that are assigned to the different computing nodes in the topology. The edge datasets are generated according to blocks 703-709; these blocks are performed for each of the possible values of Z (instead of one value of Z, as previously described).

At block 713, the encoder circuit 410 generates a flag array for each of the possible Z values. For each column position of the prospective edge datasets, there are two possible numerical values. A corresponding flag is asserted for each edge value having a first one of the numerical values, and deasserted for each edge value having the second numerical value. Alternatively, a flag is asserted if its corresponding edge value is the first edge value for a particular subject vertex in its assigned computing node. From block 713, the process 700 continues at block 715.

At block 715, the encoder circuit 410 generates a similarity array by performing a bitwise logical XNOR operation between a flag array for Zmin and a flag array for Zmax. At block 717, redundant values in the Zmin and Zmax prospective edge datasets are eliminated based on the similarity array values to produce a set of alternative values (e.g., alternative values 604).

At block 719, the flag arrays and the alternative values are saved until the number of nodes Z in the distributed computing system is known. When Z becomes known, the process 700 continues from block 719 to block 721. At block 721, the encoder circuit 410 finalizes the encoded graph dataset by selecting a flag array corresponding to the final Z value, then selecting final encoded edge values from the Zmin and Zmax alternative value arrays based on the flags. For each index position in the final edge array (e.g., final encoding 605), an encoded edge value is selected from the Zmin array when the corresponding flag in the selected flag array is 0, and from the Zmax array when the flag is 1. From block 721, the process 700 continues at block 723.

At block 723, offsets are calculated for the finalized encoding, and at block 725, the offsets and finalized edge values are distributed to their assigned computing nodes. From block 725, the process 700 continues to block 751, at the beginning of the decoding process 750.

FIG. 7B illustrates a process 750 of decoding the difference encoded graph data, according to an embodiment. The decoding process 750 is performed in components of the computing node 201, including the processing unit 304, decoder circuit 411, memory 306, etc. The process 750 decodes a portion of an encoded graph dataset 420 that is stored in the memory 306 of computing node 201.

From block 725, the decoding process 750 begins at block 751. At block 751, the decoder circuit 411 reads the offset for the initial subject vertex. The initial edge value for the subject vertex is referenced by the offset value; accordingly, at block 753, the process continues at block 757. At block 757, the encoded edge value is decoded by summing the encoded edge value with the identifier of the subject vertex. At block 759, if all of the edge values for the subject vertex have not yet been decoded, the process 750 returns to block 753.

At block 753, if the next edge value is not referenced by an offset value, then the process 750 continues at block 755. At block 755, the encoded edge value is decoded by summing the encoded edge value with a prior decoded edge value. In one embodiment, the prior edge value is the most recently decoded edge value, which is a vertex identifier for another vertex connected to the same subject vertex. The process 750 repeats blocks 753-759 until all of the edges for the subject vertex have been decoded. When all of the edges for the subject vertex have been decoded, the process 750 continues from block 759 to block 761.

At block 761, if all edge values for all of the subject vertices have not been decoded, the process 750 returns to block 751. Accordingly, blocks 751-761 repeat until all edge values for all subject vertices have been decoded. At this point, the process 750 continues from block 761 to block 763. At block 763, the decoded edge values are forwarded to the processing unit 304 for further processing, or to one or more other computing nodes via the network interface 307.

A method includes generating a portion of a graph dataset for each computing node of a plurality of computing nodes in a distributed computing system by, for each subject vertex of a plurality of vertices in a graph, recording for the computing node an offset for the subject vertex, wherein the offset references a first position in an edge array for the computing node, and for each edge of a set of edges coupled with the subject vertex in the graph, calculating an edge value for representing the edge based on a connected vertex identifier that identifies a connected vertex coupled with the subject vertex via the edge. Calculating the edge value further includes, when the edge value is assigned to the first position, determining the edge value based on a first calculation, and when the edge value is assigned to a second position in the edge array subsequent to the first position, determining the edge value based on a second calculation different from the first calculation. In the computing node, the edge value is recorded in the edge array.

In the method, the first calculation includes calculating a difference between the connected vertex identifier and a subject vertex identifier that identifies the subject vertex. The second calculation includes calculating a difference between the connected vertex identifier and a prior vertex identifier encoded at a position adjacent to a position of the calculated edge value in the edge array.

The method further includes, for at least one of the subject vertices of the plurality of vertices, storing first edge values representing a first subset of edges coupled with the at least one subject vertex in a first computing node of the plurality of computing nodes while storing second edge values representing a second subset of edges coupled with the at least one subject vertex in a second computing node of the plurality of computing nodes.

The method further includes generating a plurality of prospective edge datasets each associated with one of a plurality of prospective computing node topologies for the distributed computing system. Each of the plurality of prospective computing node topologies includes a different number of computing nodes. The method also includes, for each topology of the plurality of prospective computing node topologies, generating, for each of the computing nodes in the topology, a portion of the prospective edge dataset associated with the topology.

The method further includes, for each edge dataset position in the plurality of prospective edge datasets, and for each edge value in the edge dataset position having a first numerical value, asserting a flag in a flag array position corresponding to the edge dataset position. The method also includes, for each edge value in the edge dataset position having a second numerical value, deasserting a flag in the flag array corresponding to the edge dataset position.

The method further includes generating a similarity array by performing a bitwise logical XNOR operation between a first flag array corresponding to a first prospective edge dataset and a second flag array corresponding to a second prospective edge dataset. The plurality of prospective edge datasets includes the first prospective edge dataset and the second prospective edge dataset. The first prospective edge dataset is determined for a first topology having the fewest number of nodes of the prospective computing node topologies. The second prospective edge dataset is determined for a second topology having the greatest number of nodes of the prospective computing node topologies.

The method further includes generating the graph dataset for a topology by, for each edge dataset position, selecting one of a first value from the edge dataset position in the first prospective edge dataset and a second value from the edge dataset position in the second prospective edge dataset based on the flag array corresponding to the topology.

The method further includes, for each computing node of the plurality of computing nodes, assigning to the computing node a subset of the plurality of vertices in the graph, and in the computing node, storing edge values representing edges connecting each subject vertex of the plurality of vertices to the subset.

The method, further includes, for each computing node of the plurality of computing nodes, calculating an offset array for the computing node. A negative value in the offset array indicates that edge values for the subject vertex corresponding to the negative value are stored in another computing node of the plurality of computing nodes.

The method further includes, for each subject vertex of the plurality of vertices in the graph, decoding each of the edge values of the subject vertex in the edge array by, when the edge value is in the first position in the edge array referenced by the offset for the subject vertex, adding the edge value to a subject vertex identifier that identifies the subject vertex, and when the edge value is positioned subsequent to the first position in the edge array, adding the edge value to a prior vertex identifier that identifies another connected vertex connected to the subject vertex in the graph.

A computing device includes an input for receiving original graph data representing a graph, and an encoder circuit coupled with the input. The encoder circuit is for, based on the original graph data, generating a portion of a graph dataset for each computing node of a plurality of computing nodes in a distributed computing system. The portion of the graph dataset is generated by, for each subject vertex of a plurality of vertices in the graph, and for each edge of a set of edges coupled with the subject vertex in the graph, calculating an edge value for representing the edge based on a connected vertex identifier that identifies a connected vertex coupled with the subject vertex via the edge. The edge value is calculated by, when the edge value is assigned in the edge array to a first position referenced by an offset, determining the edge value based on a first calculation, and when the edge value is assigned in the edge array to a second position subsequent to the first position, determining the edge value based on a second calculation different from the first calculation. The computing device also includes a memory interface coupled with the encoder circuit. The memory interface is for recording, for each subject vertex of the plurality of vertices in the graph, the offset for the subject vertex in a memory system. The memory interface is also for recording, for each edge of the set of edges coupled with the subject vertex in the graph, the edge value for the edge in the edge array in the memory system.

In the computing device, the encoder circuit performs the first calculation by calculating a difference between the connected vertex identifier and a subject vertex identifier that identifies the subject vertex, and performs the second calculation by calculating a difference between the connected vertex identifier and a prior vertex identifier encoded at a position adjacent to a position of the calculated edge value in the edge array.

In the computing device, the encoder circuit resides in a processing unit, and generates the portion of the graph dataset in response to an encode instruction received by the processing unit.

In the computing device, the encoder circuit further generates, for each topology of a plurality of prospective computing node topologies, a flag array by asserting in the flag array each flag corresponding to a position in an edge array for the topology, where the position is referenced by an offset value. The encoder circuit also generates a set of alternative edge values based on a first edge array for a first topology and a second edge array for a second topology. Generating the graph dataset includes, for each edge recorded in an edge array of the graph dataset, selecting one of the alternative edge values based on a position of the edge in the edge array and based on a corresponding flag in the flag array. The flag array corresponds to a selected topology of the plurality of prospective computing node topologies.

The computing device further includes a processing unit for, for each computing node of the plurality of computing nodes, assigning to the computing node a subset of the plurality of vertices in the graph. The memory interface stores in the computing node one or more edge values representing one or more edges connecting each subject vertex of the plurality of vertices to the subset. The encoder circuit further calculates, for each computing node of the plurality of computing nodes, an offset array for the computing node.

The computing device further includes a decoder circuit coupled with the memory interface for decoding, for each subject vertex of the plurality of vertices in the graph, each of the edge values of the subject vertex in the edge array by. The decoding includes, when the edge value is in the first position in the edge array referenced by the offset for the subject vertex, adding the edge value to a subject vertex identifier that identifies the subject vertex, and when the edge value is positioned subsequent to the first position in the edge array, adding the edge value to a prior vertex identifier that identifies another connected vertex connected to the subject vertex in the graph. The memory interface is also for reading the edge values from the memory system.

A computing system, includes a plurality of computing nodes in a distributed computing system. Each of the plurality of computing nodes stores a portion of a graph dataset. The computing system includes a processing unit coupled with the plurality of computing nodes for generating the portion of the graph dataset for each computing node of a plurality of computing nodes. Generating the portion of the graph dataset includes, for each subject vertex of a plurality of vertices in a graph, recording for the computing node an offset for the subject vertex, where the offset references a first position in an edge array for the computing node, and for each edge of a set of edges coupled with the subject vertex in the graph, calculating an edge value for representing the edge based on a connected vertex identifier that identifies a connected vertex coupled with the subject vertex via the edge. Calculating the edge value includes, when the edge value is assigned to the first position referenced by the offset in the edge array, determining the edge value based on a first calculation, and when the edge value is assigned to a second position in the edge array subsequent to the first position, determining the edge value based on a second calculation different from the first calculation. In the computing node, the edge value is recorded in the edge array.

The computing system further includes a first edge array stored in a first computing node of the plurality of computing nodes, and a second edge array stored in a second computing node of the plurality of computing nodes. The first edge array includes edge values for a different number of subject vertexes than the second edge array.

In the computing system, for at least one of the subject vertices of the plurality of vertices, first edge values representing a first subset of edges coupled with the subject vertex are stored in a first computing node of the plurality of computing nodes while second edge values representing a second subset of edges coupled with the subject vertex are stored in a second computing node of the plurality of computing nodes.

The computing system further includes a network interface coupled with the processing unit for transmitting, for each computing node of the plurality of computing nodes, the portion of the graph dataset associated with the computing node to the computing node.

As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the computing device 201 and/or portions thereof carried on the computer-readable storage medium may be a database or other data structure which can be read by a program and used, directly or indirectly, to fabricate the hardware including the computing device 201. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates which also represent the functionality of the hardware including the computing device 201. The netlist may then be placed and routed to produce a data set describing geometric shapes to be applied to masks. The masks may then be used in various semiconductor fabrication steps to produce a semiconductor circuit or circuits corresponding to the computing device 201. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader scope of the embodiments as set forth in the appended claims. The specification and drawings are, accordingly, to be regarded in an illustrative sense rather than a restrictive sense.

What is claimed is:

1. A method, comprising:
generating a portion of a graph dataset for each computing node of a plurality of computing nodes in a distributed computing system by, for each subject vertex of a plurality of vertices in a graph:
recording for the computing node an offset for the subject vertex, wherein the offset references a first position in an edge array for the computing node;
for each edge of a set of edges coupled with the subject vertex in the graph, calculating an edge value for representing the edge based on a connected vertex identifier that identifies a connected vertex coupled with the subject vertex via the edge by:
when the edge value is assigned to the first position, determining the edge value based on a first calculation,
when the edge value is assigned to a second position in the edge array subsequent to the first position, determining the edge value based on a second calculation different from the first calculation, and
in the computing node, recording the edge value in the edge array.

2. The method of claim 1, wherein:
the first calculation comprises calculating a difference between the connected vertex identifier and a subject vertex identifier that identifies the subject vertex; and
the second calculation comprises calculating a difference between the connected vertex identifier and a prior vertex identifier encoded at a position adjacent to a position of the calculated edge value in the edge array.

3. The method of claim 1, further comprising:
for at least one of the subject vertices of the plurality of vertices, storing first edge values representing a first subset of edges coupled with the at least one subject vertex in a first computing node of the plurality of computing nodes while storing second edge values representing a second subset of edges coupled with the at least one subject vertex in a second computing node of the plurality of computing nodes.

4. The method of claim 1, further comprising:
generating a plurality of prospective edge datasets each associated with one of a plurality of prospective computing node topologies for the distributed computing system, wherein each of the plurality of prospective computing node topologies includes a different number of computing nodes; and
for each topology of the plurality of prospective computing node topologies, generating, for each of the computing nodes in the topology, a portion of the prospective edge dataset associated with the topology.

5. The method of claim 4, further comprising, for each edge dataset position in the plurality of prospective edge datasets:
for each edge value in the edge dataset position having a first numerical value, asserting a flag in a flag array position corresponding to the edge dataset position; and
for each edge value in the edge dataset position having a second numerical value, deasserting a flag in the flag array corresponding to the edge dataset position.

6. The method of claim 4, further comprising:
generating a similarity array by performing a bitwise logical XNOR operation between a first flag array corresponding to a first prospective edge dataset and a second flag array corresponding to a second prospective edge dataset,
wherein:
the plurality of prospective edge datasets comprises the first prospective edge dataset and the second prospective edge dataset,
the first prospective edge dataset is determined for a first topology having the fewest number of nodes of the prospective computing node topologies, and
the second prospective edge dataset is determined for a second topology having the greatest number of nodes of the prospective computing node topologies.

7. The method of claim 6, further comprising:
generating the graph dataset for a topology by, for each edge dataset position, selecting one of a first value from the edge dataset position in the first prospective edge dataset and a second value from the edge dataset position in the second prospective edge dataset based on the flag array corresponding to the topology.

8. The method of claim 1, further comprising, for each computing node of the plurality of computing nodes:
assigning to the computing node a subset of the plurality of vertices in the graph, and
in the computing node, storing edge values representing edges connecting each subject vertex of the plurality of vertices to the subset.

9. The method of claim 8, further comprising:
for each computing node of the plurality of computing nodes, calculating an offset array for the computing node, wherein a negative value in the offset array indicates that edge values for the subject vertex corresponding to the negative value are stored in another computing node of the plurality of computing nodes.

10. The method of claim 1, further comprising, for each subject vertex of the plurality of vertices in the graph, decoding each of the edge values of the subject vertex in the edge array by:
when the edge value is in the first position in the edge array referenced by the offset for the subject vertex, adding the edge value to a subject vertex identifier that identifies the subject vertex; and
when the edge value is positioned subsequent to the first position in the edge array, adding the edge value to a prior vertex identifier that identifies another connected vertex connected to the subject vertex in the graph.

11. A computing device, comprising:
an encoder circuit configured to:
receive original graph data representing a graph;
based on the original graph data, generate a portion of a graph dataset for each computing node of a plurality of computing nodes in a distributed computing system by, for each subject vertex of a plurality of vertices in the graph:
for each edge of a set of edges coupled with the subject vertex in the graph, calculating an edge value for representing the edge based on a connected vertex identifier that identifies a connected vertex coupled with the subject vertex via the edge by:
when the edge value is assigned in the edge array to a first position referenced by an offset, determining the edge value based on a first calculation, and
when the edge value is assigned in the edge array to a second position subsequent to the first position, determining the edge value based on a second calculation different from the first calculation; and
a memory interface coupled with the encoder circuit and configured to:
for each subject vertex of the plurality of vertices in the graph, record the offset for the subject vertex in a memory system, and
for each edge of the set of edges coupled with the subject vertex in the graph, record the edge value for the edge in the edge array in the memory system.

12. The computing device of claim 11, wherein the encoder circuit is further configured to:
perform the first calculation by calculating a difference between the connected vertex identifier and a subject vertex identifier that identifies the subject vertex; and
perform the second calculation by calculating a difference between the connected vertex identifier and a prior vertex identifier encoded at a position adjacent to a position of the calculated edge value in the edge array.

13. The computing device of claim 11, wherein:
the encoder circuit resides in a processing unit, and is further configured to generate the portion of the graph dataset in response to an encode instruction received by the processing unit.

14. The computing device of claim 11, wherein the encoder circuit is further configured to:
for each topology of a plurality of prospective computing node topologies, generate a flag array by asserting in the flag array each flag corresponding to a position in an edge array for the topology, wherein the position is referenced by an offset value; and
generate a set of alternative edge values based on a first edge array for a first topology and a second edge array for a second topology;
wherein:
generating the graph dataset comprises, for each edge recorded in an edge array of the graph dataset, selecting one of the alternative edge values based on a position of the edge in the edge array and based on a corresponding flag in the flag array, and
the flag array corresponds to a selected topology of the plurality of prospective computing node topologies.

15. The computing device of claim 11, further comprising:
a processing unit configured to, for each computing node of the plurality of computing nodes, assign to the computing node a subset of the plurality of vertices in the graph, wherein the memory interface is further configured to, in the computing node, store one or more edge values representing one or more edges connecting each subject vertex of the plurality of vertices to the subset;

wherein the encoder circuit is further configured to, for each computing node of the plurality of computing nodes, calculate an offset array for the computing node.

16. The computing device of claim 11, further comprising:
a decoder circuit coupled with the memory interface and configured to, for each subject vertex of the plurality of vertices in the graph, decoding each of the edge values of the subject vertex in the edge array by:
when the edge value is in the first position in the edge array referenced by the offset for the subject vertex, adding the edge value to a subject vertex identifier that identifies the subject vertex; and
when the edge value is positioned subsequent to the first position in the edge array, adding the edge value to a prior vertex identifier that identifies another connected vertex connected to the subject vertex in the graph,
wherein the memory interface is further configured to read the edge values from the memory system.

17. A computing system, comprising:
a plurality of computing nodes in a distributed computing system, wherein each of the plurality of computing nodes is configured to store a portion of a graph dataset; and
a processing unit coupled with the plurality of computing nodes and configured to generate the portion of the graph dataset for each computing node of a plurality of computing nodes by, for each subject vertex of a plurality of vertices in a graph:
recording for the computing node an offset for the subject vertex, wherein the offset references a first position in an edge array for the computing node;
for each edge of a set of edges coupled with the subject vertex in the graph, calculating an edge value for representing the edge based on a connected vertex identifier that identifies a connected vertex coupled with the subject vertex via the edge by:
when the edge value is assigned to the first position referenced by the offset in the edge array, determining the edge value based on a first calculation,
when the edge value is assigned to a second position in the edge array subsequent to the first position, determining the edge value based on a second calculation different from the first calculation, and
in the computing node, recording the edge value in the edge array.

18. The computing system of claim 17, further comprising:
a first edge array stored in a first computing node of the plurality of computing nodes; and
a second edge array stored in a second computing node of the plurality of computing nodes,
wherein the first edge array includes edge values for a different number of subject vertexes than the second edge array.

19. The computing system of claim 17, wherein:
for at least one of the subject vertices of the plurality of vertices, first edge values representing a first subset of edges coupled with the subject vertex are stored in a first computing node of the plurality of computing nodes while second edge values representing a second subset of edges coupled with the subject vertex are stored in a second computing node of the plurality of computing nodes.

20. The computing system of claim 17, further comprising:
a network interface coupled with the processing unit and configured to, for each computing node of the plurality of computing nodes, transmit the portion of the graph dataset associated with the computing node to the computing node.

* * * * *